United States Patent
Delorme et al.

(10) Patent No.: US 10,931,281 B2
(45) Date of Patent: Feb. 23, 2021

(54) LOW-POWER ACTIVE BIAS CIRCUIT FOR A HIGH IMPEDANCE INPUT

(71) Applicant: SPRYNGS, Grenoble (FR)

(72) Inventors: Nicolas Pierre Delorme, Grenoble (FR); Christophe Le Blanc, Grenoble (FR); Daniel Saias, Grenoble (FR)

(73) Assignee: SPRYNGS, Grenoble (FR)

(*) Notice: Subject to any disclaimer, the term of this patent is extended or adjusted under 35 U.S.C. 154(b) by 0 days.

(21) Appl. No.: 16/486,102

(22) PCT Filed: Jan. 11, 2018

(86) PCT No.: PCT/FR2018/050063
§ 371 (c)(1),
(2) Date: Aug. 14, 2019

(87) PCT Pub. No.: WO2018/150111
PCT Pub. Date: Aug. 23, 2018

(65) Prior Publication Data
US 2020/0235738 A1    Jul. 23, 2020

(30) Foreign Application Priority Data
Feb. 16, 2017 (FR) .................... 17 51267

(51) Int. Cl.
*H03K 3/011* (2006.01)
*H03K 19/017* (2006.01)
*G01R 31/3177* (2006.01)

(52) U.S. Cl.
CPC ... *H03K 19/01721* (2013.01); *G01R 31/3177* (2013.01)

(58) Field of Classification Search
CPC ..................... G01R 31/3177; H03K 19/01721
See application file for complete search history.

(56) References Cited

U.S. PATENT DOCUMENTS 4,813,020 A    3/1989 Iwamura et al.
5,420,526 A *  5/1995 Fensch ................ G11C 7/1048
                                                        326/30

(Continued)

FOREIGN PATENT DOCUMENTS

EP    0600816 A2    6/1994
EP    0762648 A2    3/1997

OTHER PUBLICATIONS

ISA/EP, "International Preliminary Report on Patentability," International Application No. PCT/FR2018/050063, dated Aug. 20, 2019, 15 pages.

(Continued)

*Primary Examiner* — Kurtis R Bahr

(57) ABSTRACT

The invention relates to a floating state detection circuit of a node, comprising a first conductivity type MOS transistor (M1) connected between the node (N) and a first power supply line (Vss); and a second MOS transistor (M2) of conductivity type complementary to the first conductivity type, controlled by the node (N) and connected between the gate of the first transistor (M1) and a second supply line (Vdd). In addition, a third MOS transistor (M3) of the first conductivity type connected between the gate of the first transistor (M1) and the first supply line (Vss) may be controlled by the node (N).

6 Claims, 1 Drawing Sheet

(56) References Cited

U.S. PATENT DOCUMENTS

| | | | | |
|---|---|---|---|---|
| 5,490,110 A | * | 2/1996 | Sawada | G11C 11/5621 |
| | | | | 365/185.03 |
| 2004/0008056 A1 | * | 1/2004 | Kursun | H03K 19/0016 |
| | | | | 326/96 |
| 2010/0097129 A1 | * | 4/2010 | Itoh | H03K 19/00315 |
| | | | | 327/537 |

OTHER PUBLICATIONS

ISA/EP, "International Search Report and Written Opinion of the International Searching Authority," International Application No. PCT/FR2018/050063, dated May 3, 2018, 16 pages.

\* cited by examiner

LOW-POWER ACTIVE BIAS CIRCUIT FOR A HIGH IMPEDANCE INPUT

CROSS-REFERENCE TO RELATED APPLICATIONS

This application is a 371 National Stage of International Application No. PCT/FR2018/050063, filed Jan. 11, 2018, which claims priority to French Patent Application No. 1751267, filed Feb. 16, 2017, the disclosures of which are herein incorporated by reference in their entirety.

FIELD

The present patent application relates to the acquisition of signals supplied by sensors, which signals can switch between a low impedance state and a high impedance state. In certain situations, it may in particular be sought to recognize a high impedance state as a defined logic state.

BACKGROUND

In FIG. 1, a sensor providing a signal to be measured is embodied by a switch S. It is sought to know whether the switch is open or closed. The switch S is connected between a high power supply line Vdd and an input of a digital processing circuit, generally a logic gate, illustrated by an inverter 10.

When the switch S is closed, the input of the inverter 10 is connected to the line Vdd through a low impedance path that unambiguously determines the state "1".

When the switch S is open, it has a high impedance, whereby, in the absence of other measures, the input of the inverter is floating and has no defined state. To avoid this, the input of the inverter is generally biased to the low supply line Vss by a pull-down impedance R.

The presence of a pull-down impedance inevitably produces a static current consumption when the switch S is closed. The value of the impedance R, preferably as high as possible, is, however, chosen to be sufficiently low for the discharge of the inverter input node to the Vss line to occur at a satisfactory speed. In low-power applications, such static currents are not desired.

To reduce the static consumption in the context of a three-state signal ("0", "1", and "Hi-Z" or high impedance) U.S. Pat. No. 6,133,753 proposes to intermittently measure the state of an input node. Thus, the circuit consumes current only during the measurement phases. However, an intermittent measurement is not suitable for measuring brief events that could occur between two measurement phases.

SUMMARY

The present application generally provides a floating state detection circuit of a node, comprising a first MOS transistor of a first conductivity type connected between the node and a second supply line; and a second MOS transistor of a conductivity type complementary to the first conductivity type, controlled by the node and connected between a gate of the first transistor and the first supply line.

Preferably, the circuit further comprising a third MOS transistor of the first conductivity type, controlled by the node and connected between a gate of the first transistor and the second supply line.

The first and second transistors may have a lower threshold voltage than the third transistor.

The circuit may include a mechanical switch connected between the node and the first supply line.

The node may be connected to an input of a processing circuit.

A method is also provided for detecting a floating state of a node, comprising the steps of: the node being initially at a first voltage, discharging the node to a second voltage by a leakage current of a first MOS transistor in an off state; and when the difference between the voltage at the node and the first voltage reaches a threshold of a second MOS transistor, turning on the first MOS transistor.

The method may include the steps of: the node being initially at the second voltage, pulling the node towards the first voltage by closing a switch; and when a difference between the voltage at the node and the second voltage reaches a threshold of a third MOS transistor, turning off the first MOS transistor.

BRIEF DESCRIPTION OF DRAWINGS

Other advantages and features will become more clearly apparent from the following description of particular embodiments of the invention provided for exemplary purposes only and represented in the appended drawings, in which.

DESCRIPTION OF EMBODIMENTS

Figure 2:
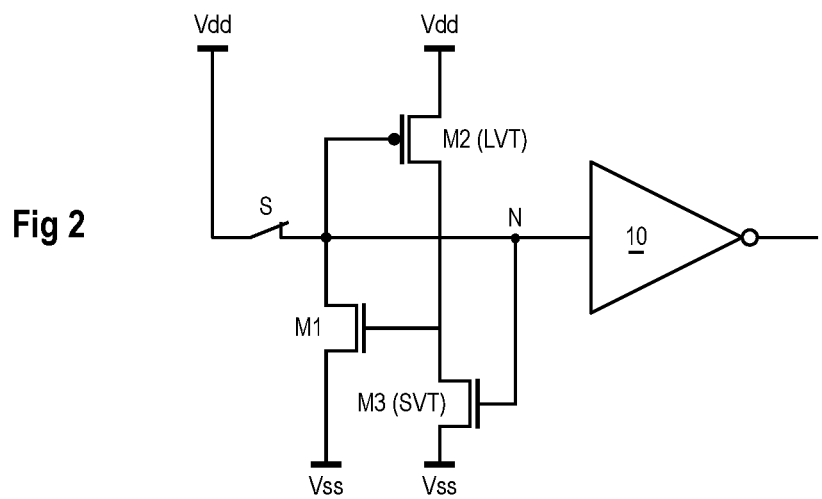
FIG. 2 illustrates an embodiment of a floating state detection circuit of a node, having a low static consumption.

FIG. 2 schematically shows an embodiment of a circuit designed to establish a determined logic level on a floating node N, without using a bias current, even intermittently.

Figure 1:
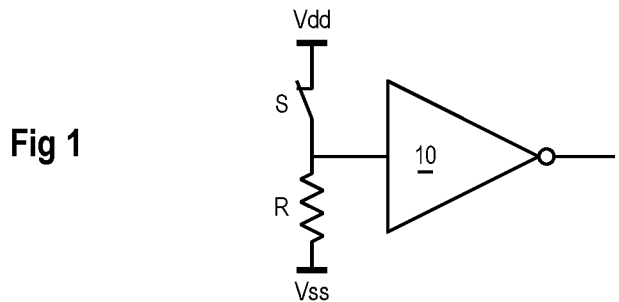
FIG. 1, previously described, schematically illustrates a conventional measurement circuit of the state of a switch.

The circuit is shown in a configuration for detecting the state of a switch S connected to a high power supply line Vdd, as in FIG. 1. The voltage Vdd may represent the logic level "1", which level is transmitted unambiguously to the node N when the switch S is closed. The logic level "0" would then be represented by the voltage of a low supply line Vss.

In this configuration, it is desired that the level on the node N is perceived as a "0" by the gate 10 when the switch S is open. For this purpose, the circuit of FIG. 2 is configured to force the node N to the low voltage Vss when the node becomes floating.

More specifically, the embodiment of FIG. 2 comprises two complementary MOS transistors M1 and M2 connected to form a latch that triggers upon the lowering of the voltage of node N, to confirm the low state (Vss) of this node. The transistor M1, an N-channel, has its source connected to the line Vss and its drain connected to the node N. The transistor M2, a P-channel, has its source connected to the line Vdd, its gate connected to the node N, and its drain connected to the gate of transistor M1.

This configuration makes it possible to detect the opening of the switch S, i.e. the transition to the floating state of the node N. The switch S being initially closed, the node N is at voltage Vdd. The transistor M2 is off, its gate-source voltage being zero. It is assumed that the transistor M1 is also off, which can be obtained by biasing the gate of the transistor M1 to the voltage Vss by a transistor M3.

The specific role of transistor M3 as shown will be described later—it is assumed for the moment that it acts only as a constant current source for biasing the gate of transistor M1.

In this configuration, the transistors M1 and M2 being off, the circuit consumes no static bias current. Only the leakage current of the transistor M1 through the closed switch S and the leakage current of the transistor M2 through the transistor M3 remain. A transistor leakage current is generally several orders of magnitude lower than a bias current.

Figure 3:
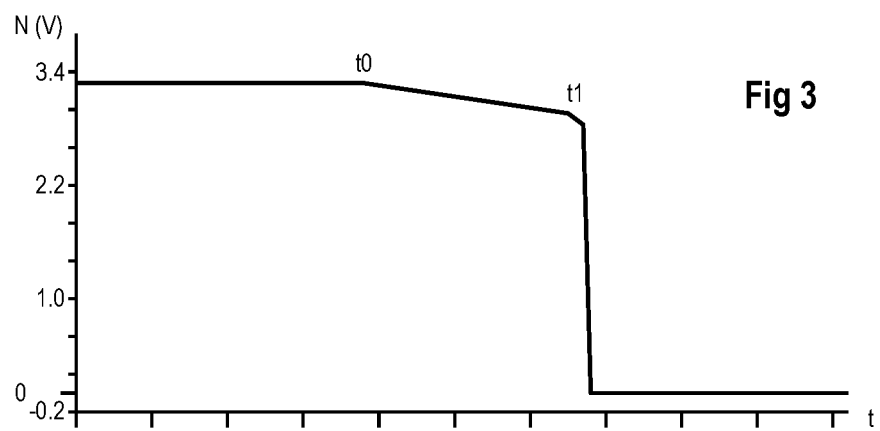
FIG. 3 is a graph illustrating an example of an evolution of the voltage of a node switched from a biased state to a floating state, using the circuit of FIG. 2.

FIG. 3 is a graph illustrating an example of evolution of the voltage of node N occurring when the switch S is opened.

When the switch S is opened at a time t0, the node N becomes floating, assuming that the processing circuit 10 is based on MOS transistors, for example in CMOS technology. The voltage at node N is temporarily maintained by the parasitic capacitances of the elements connected to the node, in particular the gate capacitance of the transistor M2 and of the transistors forming the input of the logic gate 10. However, despite the fact that the transistor M1 is in its off state, it has an unavoidable leakage current, as previously mentioned. As a result, the voltage at node N begins to slowly decrease towards the low voltage Vss, as illustrated between the time t0 and a time t1.

At time t1, the difference between the voltage at node N and the high voltage Vdd reaches the threshold of the transistor M2. The transistor M2 starts turning on and raises the voltage on the gate of the transistor M1. The transistor M1 in turn starts turning on and pulls the node N faster towards the voltage Vss. Transistors M1 and M2 mutually confirm their on states and assume a locked state. The node N then produces a stable logical level "0" and at low impedance.

When the switch S is closed again, it pulls the node N to the voltage Vdd despite the antagonistic effect of the transistor M1. The transistor M1, generally a smaller transistor of the technological node used, has a substantially higher impedance when on than a closed switch. When the voltage at node N is sufficiently close to the voltage Vdd, the transistor M2 turns off and no longer supplies the gate of the transistor M1. The gate of the transistor M1 is pulled towards the low voltage Vss by the transistor M3, causing the transistor M1 to turn off.

In the configuration where the node N is at the level "0", namely where the transistors M1 and M2 are locked in the on state, if the transistor M3 was a simple current source, the circuit would consume a static current through the transistors M2 and M3. To cancel this current consumption, the gate of the transistor M3, an N-channel transistor, is in fact connected to the node N, as shown. This configuration produces several effects.

When the node N is at level "0" and the transistors M1 and M2 are on, the transistor M3 is off, eliminating the bias current that could flow between the transistor M2 and the line Vss. The circuit then consumes no bias current.

Furthermore, when the switch S is closed, the transistor M3 is turned on relatively early during the raising of the voltage at node N towards the voltage Vdd, causing the early turning off of the transistor M1 and limiting the peak current flowing through the switch and the transistor M1.

From the time t1 after the opening of the switch S, when the transistor M2 turns on, a phase of simultaneous conduction of the transistors M2 and M3 may remain, the transistor M3 turning off later during the decrease the voltage at node N. The transistor M2 may be designed larger than the transistor M3, so that it pulls the gate of the transistor M1 faster towards the voltage Vdd despite the antagonism of the transistor M3.

A phase of simultaneous conduction of the transistors M2 and M3 also occurs when the switch S is closed, when the voltage at node N rises towards the voltage Vdd, in a range where the thresholds of the transistors M2 and M3 are simultaneously exceeded. If it were desired to avoid simultaneous conduction, the sum of the thresholds of transistors M2 and M3 should be at least equal to the supply voltage Vdd.

According to an embodiment, the transistor M2 may be a so-called LVT transistor ("Low-Vt" or low threshold voltage), while the transistor M3 is an SVT transistor ("Standard-Vt").

Then, at the opening of the switch S, the transistor M2 becomes conductive earlier during the decrease of the voltage at node N towards the voltage Vss, thus shortening the interval t0-t1.

This however increases the phase of simultaneous conduction of the transistors M2 and M3, an increase that is partially compensated by the fact that the transistor M3 has a normal threshold (SVT).

The transistor M1 can be an LVT or an SVT. If it is an LVT, it will present a slightly higher leakage current in the off state, also helping to shorten the interval t0-t1 without significantly increasing the static consumption of the circuit.

The graph of FIG. 3 corresponds to an example of elementary transistors in a CMOS technology of 180 nm. The LVT and SVT thresholds are then 0.4 V and 0.6 V. The temporal graduations of the graph correspond to 5 ns. The current peak caused at the closing of the switch S reaches about 350 µA over a time interval of about 2 ns, this peak including the simultaneous conduction of the transistors M2 and M3. The peak current caused by the simultaneous conduction of transistors M2 and M3 at the opening of the switch reaches about 14 µA over a time interval of about 1 ns.

According to another embodiment, if it is desired to reduce the current peak caused by the closing of the switch S, the threshold of the transistor M3 can be decreased and the threshold of the transistor M2 can be increased, that is to say, invert the LVT and SVT types of these transistors. In this case, upon closing of the switch S, the transistor M3 turns on earlier, causing an earlier turning off of the transistor M1. The phase of simultaneous conduction of the transistors M2 and M3 remains unchanged, since the sum of the threshold voltages of the transistors M2 and M3 is unchanged.

Many variations and modifications of the embodiments described herein will be apparent to those skilled in the art. The described embodiments are intended to detect the state of a switch connected to a high supply voltage Vdd. A dual configuration may be provided to detect the state of a switch connected to the low supply voltage Vss, obtained by inverting the conductivity types of the transistors and the supply lines.

The invention claimed is:

1. A circuit for detecting a floating state of a node, the circuit comprising:
    a node connected, in operation, for having two operating states including a low impedance state where the node is connected to a first power supply line through a low impedance path, and a floating state where no element establishes a voltage of the node;
    a first MOS transistor of a first conductivity type connected between the node and a second supply line;

a second MOS transistor of a conductivity type complementary to the first conductivity type, controlled by the node and connected between a gate of the first transistor and the first supply line; and a third MOS transistor of the first conductivity type, controlled by the node and directly connected between the gate of the first transistor and the second supply line.

2. The circuit of claim 1, wherein the first and second transistors have a lower threshold voltage than the third transistor.

3. A circuit for detecting a floating state of a node, the circuit comprising:

a mechanical switch connected between the node and a first power supply line;

a first MOS transistor of a first conductivity type connected between the node and a second supply line; and a second MOS transistor of a conductivity type complementary to the first conductivity type, controlled by the node and connected between a gate of the first transistor and the first supply line.

4. The circuit of claim 3, wherein the node is connected to an input of a processing circuit.

5. A method for detecting a floating state of a node, the method comprising:

connecting the node to a first voltage through a low impedance path;

interrupting the low impedance path to place the node in a floating state where no element establishes a voltage of the node;

discharging the node to a second voltage by a leakage current of a first MOS transistor in an off state; and when a difference between the voltage at the node and the first voltage reaches a threshold of a second MOS transistor, turning on the first MOS transistor.

6. The method of claim 5, comprising:

the node being initially at the second voltage, pulling the node towards the first voltage by closing a switch; and when a difference between the voltage at the node and the second voltage reaches a threshold of a third MOS transistor, turning off the first MOS transistor.

* * * * *